United States Patent [19]

Miyashiro et al.

[11] Patent Number: 4,932,039

[45] Date of Patent: Jun. 5, 1990

[54] PULSE INTERFERENCE CANCELER OF HIGH POWER OUT-OF-BAND PULSE INTERFERENCE SIGNALS

[75] Inventors: Stanley K. Miyashiro; Francis E. Morris; Albert T. Roome, all of San Diego, Calif.

[73] Assignee: The United States of America as represented by the Secretary the Navy, Washington, D.C.

[21] Appl. No.: 364,048

[22] Filed: Jun. 8, 1989

[51] Int. Cl.$^5$ ............................................. H04B 1/10
[52] U.S. Cl. .................................. 375/102; 364/574; 328/163; 375/104
[58] Field of Search ................ 375/102, 104, 88; 364/574, 582; 340/825.5; 370/85.2; 455/302, 303, 306, 285; 371/59; 328/163

[56] References Cited

U.S. PATENT DOCUMENTS

| | | | |
|---|---|---|---|
| 3,870,996 | 3/1975 | Miller | 343/18 E |
| 3,963,990 | 6/1976 | DiFonzo | 455/304 |
| 4,008,439 | 2/1977 | Schroeder | 364/574 |
| 4,475,215 | 10/1984 | Gutleber | 375/34 |
| 4,501,004 | 2/1985 | Yoshida et al. | 375/102 |
| 4,561,067 | 12/1985 | McKeown | 364/819 |
| 4,646,097 | 2/1987 | King | 375/102 |
| 4,688,235 | 8/1987 | Tahara et al. | 375/102 |

Primary Examiner—Benedict V. Safourek
Assistant Examiner—M. Huseman
Attorney, Agent, or Firm—Harvey Fendelman; Thomas Glenn Keough; Peter A. Lipovsky

[57] ABSTRACT

A pulse interference canceler cancels pulse interference signals by normalizing the signals and comparing in time the normalized signals to each other. An overlap of the normalized signals indicates that both channels of the pulse receiver received transmissions simultaneously or near simultaneously, thereby indicating interfering signals. Detection of the simultaneous or near simultaneous normalized pulses generates a blanking pulse that suppresses any output pulses corresponding to the received interfering signals.

30 Claims, 4 Drawing Sheets

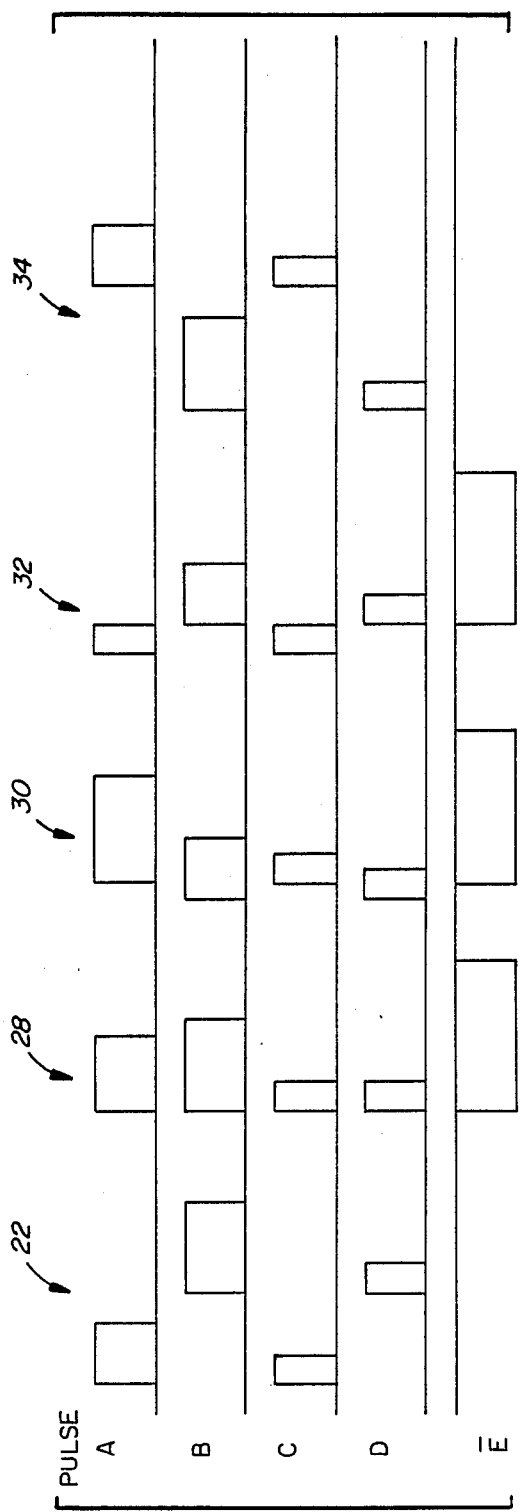
FIG. 3
FIG. 5
FIG. 4

PULSE INTERFERENCE CANCELER OF HIGH POWER OUT-OF-BAND PULSE INTERFERENCE SIGNALS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

1. Field of the Invention

This invention pertains broadly to the field of communications. More particularly, the invention pertains to communication receivers. In still greater particularity, but without limitation thereto, the invention relates to a communications system and method for cancelling high power out-of-band pulse interference signals.

2. Description of the Prior Art

As airwave communications become more and more crowded, it is common for communication receivers to pick up undesirable transmissions. This is particularly the case where various receivers and transmitters are located in close proximity as well as where communication channels are close in frequency. In cases in which alarm or counter circuits are used in conjunction with receiver systems, the reception of undesired transmissions can result in false alarms or inaccurate counts.

Where radar systems are used, reception of undesired transmissions can lead radar operators to believe that objects exist where they do not actually exist. The interfering signals can further mask the location of objects within the radar's range, thus providing an apparently free path for objects to be guided through. In either case lives may be endangered and property may be jeopardized.

In many cases the source of interfering signals lies with transmitters operating close to or on a receiver's operating frequency. In other cases these interfering signals are caused by transmitters broadcasting transient pulses having frequency components that fall within the frequency range of the monitoring receiver. Further, radar and TV transmitters often broadcast signals of such high signal strength or power that normal reception on nearby receivers becomes masked or obscured.

SUMMARY OF THE INVENTION

The invention substantially suppresses the above referred to interferences by providing a pulse interference canceler that cancels pulse interference received on a two channel pulse receiver. Both in and out-of-frequency band pulse receptions received simultaneously or near simultaneously on both channels are cancelled as interfering signals. Canceling these signals prevents a receiver operator from being deceived or becoming confused by the presence of the interfering signals.

The invention includes channel normalizers that are individual to each receiver channel. The normalizers normalize signals received over the channels into normalized pulses of pre-selected pulse widths. These normalized pulses are received by a coincidence pulse detector common to the channels and by output delay and pulse generating elements individual to the channels.

The coincidence pulse detector generates a blanking pulse in the event that interfering signals are received, that is, when the normalized pulse generated on one channel falls within the pulse width of the normalized pulse generated on the other channel.

The output delay and pulse generating elements each generate an output pulse that will be received by the receiver operator unless interfering signals are present. These output pulses are of pre-selected pulse widths and are each delayed by the pulse width of the earlier generated normalized pulses. This delay prevents the generation of the output pulses before the coincidence pulse detector has compared the normalized pulses of the two channels.

If the normalized pulse of either channel occurs within the pre-selected pulse width of the normalized pulse of the other channel, the blanking pulse generated in the coincident pulse detector suppresses both the first channel output pulse and the second channel output pulse. This suppression is done in channel suppression gates individual to the channels.

OBJECTS OF THE INVENTION

It is an object of the invention to provide an improved communications interference canceler.

Another object of the invention is to provide an improved communications interference canceler for pulse receivers.

Yet a further object of the invention is to provide an improved communications interference canceler for cancelling out-of-band pulse interference received on a pulse receiver.

Another object of the invention is to provide an improved communications interference canceler for cancelling high power pulse interference received on a pulse receiver.

Yet another object of the invention is to provide for incoherent cancelling of out-of-frequency band pulse interference received on pulse receivers.

Other objects, advantages and new features of the invention will become apparent from the following detailed description of the invention when considered in conjunction with the accompanied drawings.

BRIEF DESCRIPTION OF THE DRAWINGS

FIG. 3 shows a succession of representative received waveforms as processed by channel normalizers and a coincident pulse detector utilized in accordance with the invention.

FIGS. 4 and 5 show representative received waveforms as processed by the channel normalizer and by the output delay and generator element of receiver channels 1 and 2, respectively.

DESCRIPTION OF THE PREFERRED EMBODIMENT

Figure 1:
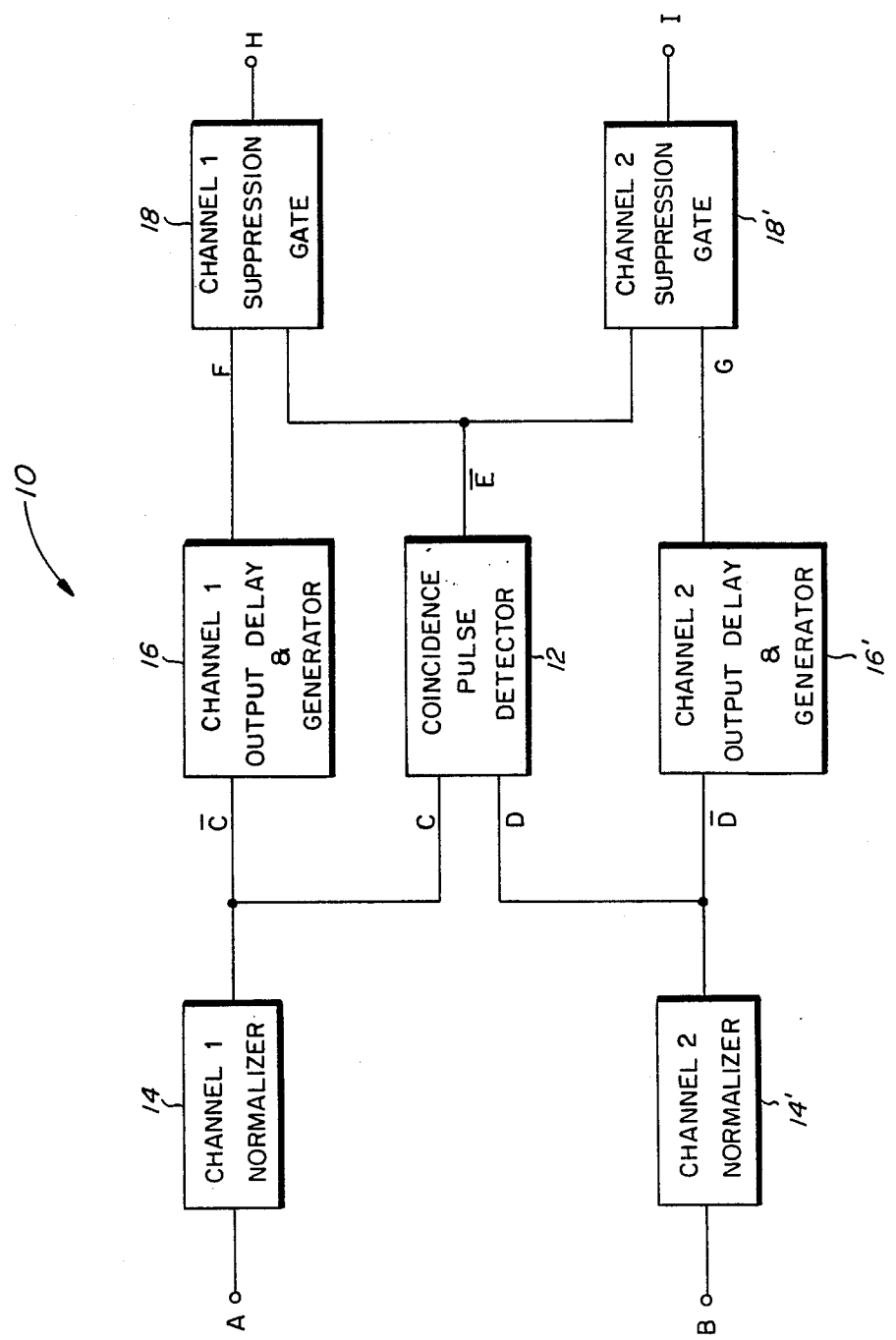
FIG. 1 is a block diagram representation of a pulse interference canceler in accordance with the invention.

Referring to FIG. 1, a block diagram representation of a pulse interference canceler 10 is shown constructed in accordance with the invention. Filtered radio frequency (RF) pulse signals received upon a two channel pulse receiver, not shown, are converted to video and input into interference canceler 10 as "A", corresponding to channel 1, and as "B", corresponding to channel 2.

The elements of interference canceler 10 are identical for each channel with both channels sharing a coincidence pulse detector 12. Received signal pulses incoming on channel 1 and channel 2, "A" and "B" respectively, are input into channel normalizers 14 and 14', respectively. The channel normalizers receive transmitted pulses of various pulse widths and normalize these pulses into pulses of pre-selected pulse widths. In a preferred embodiment of the invention, the normalized pulses of both channels were selected to have pulses of substantially equal widths. The significance of these pre-selected pulse widths will be explained below.

An output of channel 1 normalizer 14 is input into coincidence pulse detector 12 as "C". In like manner an output of channel 2 normalizer 14' is input into pulse detector 12 as "D". If the normalized pulses of normalizers 14 and 14' fall in time within each other's pulse width, coincidence pulse detector 12 will output a blanking pulse, as will be further discussed. Normalizers 14 and 14' further output inverted normalized pulses C-bar and D-bar, respectively. Pulses C-bar and D-bar are of pulse widths that equal the pulse widths of pulses C and D, respectively. Normalized pulses C-bar and D-bar are input, respectively, into output delay and pulse generator elements 16 and 16'.

The output delay and pulse generator elements are individual to the channels. Each generate an output pulse of pre-selected pulse width that is delayed by a pulse width that is substantially equal to the pulse width of the input normalized pulses. This delay permits time for comparing the normalized pulses C and D in coincidence pulse detector 12.

In instances where signals are received simultaneously or near simultaneously over both channels, these signals will be considered interfering and will be suppressed. The leading edge of the received pulse signals is used by the channel normalizers to generate the normalized pulses of preselected pulse widths. Signal suppression occurs when the normalized pulses occur simultaneously or when one normalized pulse occurs within the pulse width of the other. The output pulses, shown in FIG. 1 as "F" and "G", from output delay and pulse generator elements 16 and 16', respectively, will then be suppressed by the blanking pulse "E-bar" in channel suppression gates 18 and 18', corresponding to channels 1 and 2, respectively.

If, however, normalized pulses "C" and "D" are not simultaneous or within the pre-selected pulse width of each other, output pulses "F" and "G" of output delay and pulse generator elements 16 and 16' will pass through channel suppression gates 18 and 18' as "H" and "I", respectively. Pulses "H" and "I" will then be presented for observation by the receiver operator.

Figure 2:
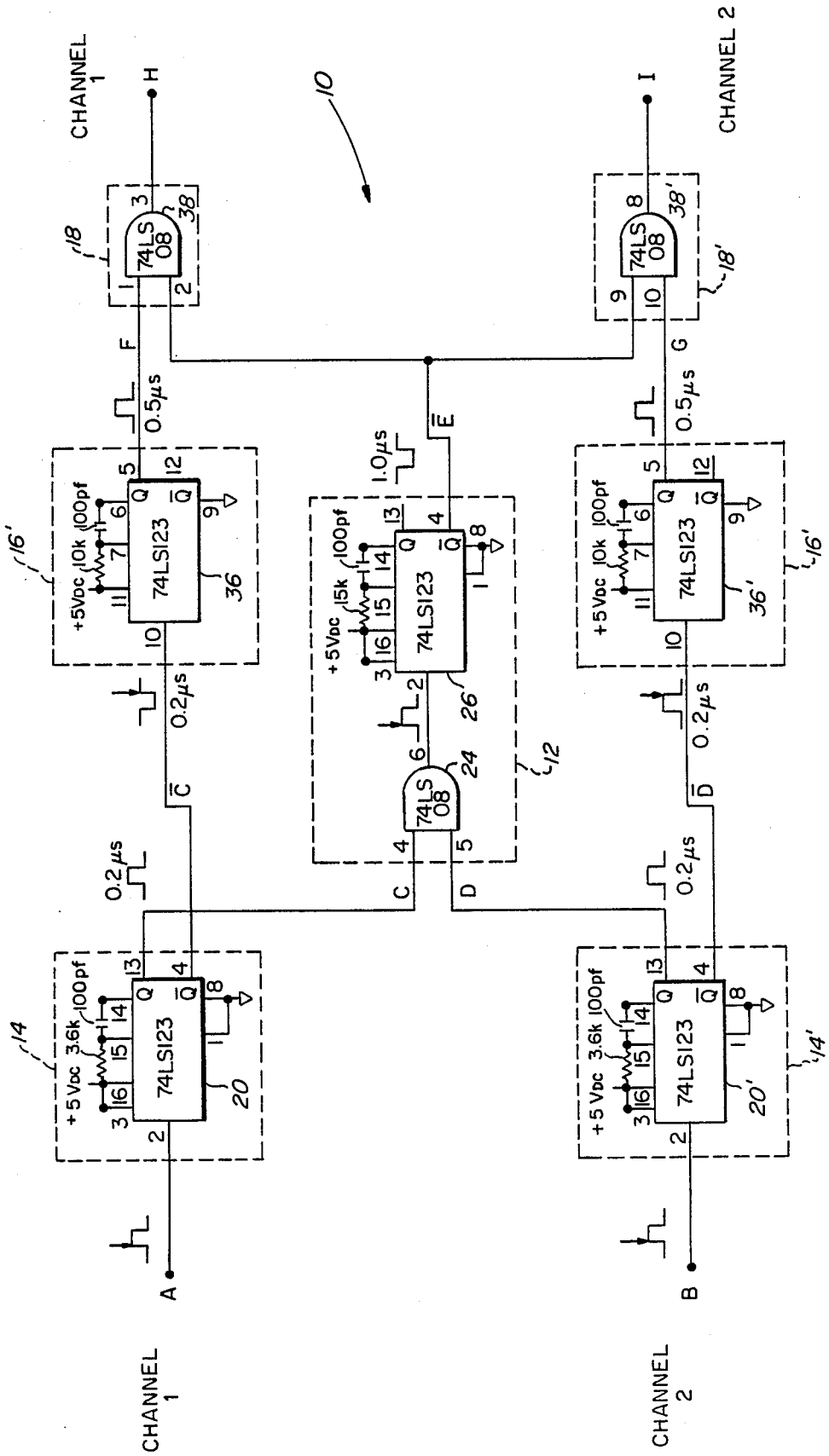
FIG. 2 is a schematic corresponding to FIG. 1 of a representative embodiment of the invention incorporating transistor-transistor logic (TTL).

Turning now to FIG. 2, greater details of interference canceler 10 are shown. The embodiment shown in FIG. 2 is a TTL schematic offered to enable one skilled in the art to make and use the interference canceler of the invention. Obviously, this embodiment should not be construed as the only manner in which the invention may be constructed as those skilled in the art will realize that other ways of effectuating the invention are possible.

As previously stated, received pulse signals are input into pulse interference canceler 10 as A and B. These pulses are received by channel normalizers 14 and 14' which include a retriggerable monostable multivibrator 20 and 20', respectively. Multivibrators 20 and 20' can each be half of a dual retriggerable monostable multivibrator such as one having the commercial designation 74LS123. The multivibrators each have a resistor-capacitor (RC) circuit to permit the normalized pulses output from the multivibrators to be tailored to a pre-selected pulse width.

In this particular embodiment of the invention, normalized pulses C and C-bar and D and D-bar were selected to be of a 0.2 microsecond pulse width triggered upon the leading edge of incoming pulses A and B. This is shown in FIG. 3. In FIG. 3, pulse sequence 22 shows normalized pulses C and D generated from the leading edge of incoming pulses A and B, respectively. The criteria for selecting the pulse width of the normalized pulses will be disclosed as the invention is further described.

Turning to both FIGS. 2 and 3, if the normalized pulses C and D overlap each other's pulse width so as to be simultaneously applied to coincidence pulse detector 12, an AND gate 24 of detector 12 outputs a positive pulse. This AND gate can be one-quarter of a commercially available 74LS08.

The positive pulse from AND gate 24 is applied to a multivibrator 26 also a part of coincidence pulse detector 12. Multivibrator 26 can be one-half of a dual retriggerable monostable multivibrator such as a 74LS123. Multivibrator 26 has an RC circuit that, in this specific embodiment of the invention, is tailored to limit output blanking pulse E-bar to a preselected pulse width. In the embodiment of the invention disclosed, blanking pulse E-bar was selected to be of a 1.0 microsecond pulse width for reasons to be discussed.

Referring to FIG. 3, pulse sequences corresponding to pulse inputs A and B, normalized pulses C and D, and blanking pulse E-bar are shown. Sequence 22, as previously explained, shows how normalized pulse C is of a pre-selected pulse width generated upon the leading edge of incoming pulse A. Likewise, normalized pulse D is of a pre-selected pulse width that is generated upon the leading edge of incoming pulse B.

In sequence 28 incoming pulses A and B arrive simultaneously at interceptor 10 to generate simultaneous normalized pulses C and D. Blanking pulse E-bar is generated for a pre-selected pulse width triggered upon the overlap of normalized pulses C and D, in this case at the leading edge of pulses C and D. Sequence 30 shows yet another representative succession of pulses where, in this instance, pulses A and B are received closely enough in time to generate overlapping normalized pulses C and D, thereby producing blanking pulse E-bar. Sequence 32 shows yet another sequence of pulses in which case pulses A and B are received by interference canceler 10 so as to generate normalized pulses C and D that overlap just enough in time to generate blanking pulse E-bar. Sequence 34 of FIG. 3 shows that pulses A and B, received by interference canceler 10, were separated enough in time to prevent the generation of the blanking pulse.

The normalizers of the interference canceler of the invention produce normalized pulses of predictable pulse widths so that regardless of the pulse width of incoming received signals, the pulse widths of the normalized pulses will be known. The pulse width of the normalized pulses is selected to compensate for slight lags between the reception of incoming pulses A and B to canceler 10. These lags can be due to interference that sweeps through the frequency ranges accepted by the receiver as well as due to slight delays caused by the receiver channel processing time corresponding to the different frequency characteristics accepted by the channels.

The pulse width of the normalized pulses is also used as a delay for further system processing.

Referring again to FIG. 2, negative pulse waveforms C-bar and D-bar can be seen to be output respectively from normalizers 14 and 14'. Pulse C-bar is an inverse reflection of normalized pulse C with pulse D-bar being an inverse reflection of normalized pulse D. Pulses C-bar and D-bar are applied to output delay and pulse generator elements 16 and 16', respectively. The output delay and pulse generator elements each include a retriggerable monostable multivibrator, shown as 36 and 36', that can each be half of a dual retriggerable monostable multivibrator such as a 74LS123.

Multivibrators 36 and 36' have RC circuits that are identically tailored to generate output pulses of a preselected pulse width. In this particular embodiment of the invention, the output pulse F of multivibrator 36 and output pulse G of multivibrator 36' were each chosen to be of a 0.5 microsecond pulse width.

Output pulses F and G are delayed by the preselected pulse width of normalized pulses C-bar and D-bar, respectively, to prevent the generation of an output pulse while normalized pulses A and B are compared in coincidence pulse detector 12. The delay in output pulses F and G was accomplished by adjusting multivibrators 36 and 36' to trigger upon the trailing edge of C-bar and D-bar, respectively, as can best be seen in FIGS. 4 and 5.

In FIG. 4, pulses "A" incoming to pulse interference canceler 10 causes inverse normalized pulses C-bar to be triggered upon the leading edge of the incoming pulses. The output pulses F of the channel 1 output delay and pulse generator element 16, shown in FIG. 2, triggers upon the trailing edge of inverse normalized pulse C-bar. FIG. 5 shows pulses corresponding to the channel 2 inputs into interference canceler 10 as processed by channel normalizer 14' and output delay and pulse generator element 16', shown in FIGS. 1 and 2. Output pulse G is delayed by the pulse width of normalized pulse D-bar by triggering on the trailing edge of the normalized pulse.

Referring again to FIGS. 1 and 2, it can be seen that output pulses F and G are applied to suppression gates 18 and 18', respectively. Suppression gates 18 and 18' include individual AND gates, 38 and 38', respectively. Gates 38 and 38' can, for example, each be one-quarter of a commercially available 74LS08.

When coincidence pulse detector 12 outputs inverse blanking pulse E-bar, the blanking pulse is applied simultaneously to both suppression gates 18 and 18'. As discussed, output pulses F and G are delayed by the pre-selected pulse width of the normalized pulses, 0.2 microseconds, as coincidence pulse detector 12 may take up to 0.2 microseconds to find a coincidence pulse. If no coincidence pulses are detected, output pulses F and G will pass through suppression gates 18 and 18' as pulses H and I, to be ultimately observed by an operator of a receiver utilizing interference suppressor 10.

If however a simultaneous coincidence pulse is detected, inverse blanking pulse E-bar from pulse detector 12 will be applied to pulse suppression gates 18 and 18' to suppress the outputs F and G from further receiver processing. Blanking pulse E-bar is selected of a pulse width that is wide enough to accommodate the maximum pulse comparison time as well as the pulse width of the output pulses of output delay and pulse generator elements 16 and 16'. In the embodiment of the invention disclosed, blanking pulse E-bar was made 0.3 microseconds longer than the combined delay and output pulse so as to compensate for various component fluctuations such as due to discrepancies in component manufacturing as well as to the effects of temperature on component circuitry.

Figure 6:
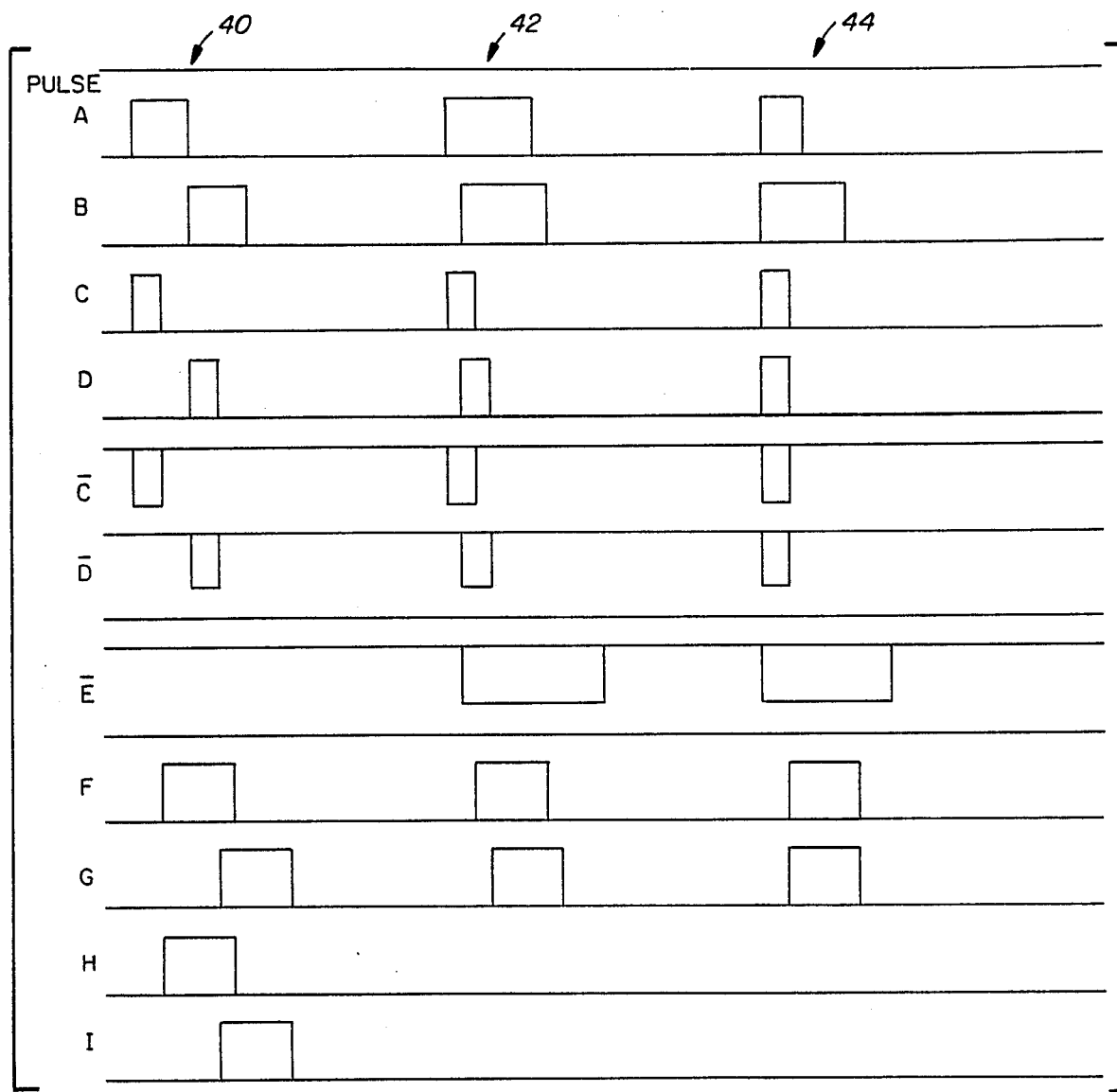
FIG. 6 shows representative received waveforms as processed in accordance with the invention.

Referring now to FIG. 6 in conjunction with FIG. 1, a better understanding of the pulse interference canceler of the invention is possible. In pulse sequence 40, pulses A and B are received by pulse interference canceler 10 and are normalized into normalized pulses C and D, respectively. These normalized pulses are triggered upon the leading edge of the received pulses. As normalized pulses C and D do not overlap in time, no blanking pulse E-bar is generated. The inverse of normalized pulses C and D, C-bar and D-bar, are used to generate output pulses F and G, with output pulses F and G, triggering upon the trailing edge of pulses C-bar and D-bar, respectively. As no blanking pulse E-bar is present, output pulses F and G pass through suppression gates 18 and 18' to be presented for further receiving processing as pulses H and J, respectively.

In pulse sequence 42 of FIG. 6, pulses A and B are received by canceler 10 close in time so that normalized pulses C and D overlap thereby creating blanking pulse E-bar. The presence of blanking pulse E-bar at suppression gates 18 and 18' of FIG. 1 prevents the output of outputs F and G from appearing as H and I. Similarly, sequence 44 shows pulses A and B arriving simultaneously at interference canceler 10 so that normalize pulses C and D overlap to generate blanking pulse E-bar. Blanking pulse E-bar suppresses output pulses F and G in pulse suppressors 18 and 18' so that no output exists at H and I.

Though the invention has been described as utilizing video pulses converted from radio frequency (RF) pulses, the invention may also be used with non-converted RF pulses. Further, though the invention is shown as utilized with a single two channel pulse receiver, the invention may be utilized with any multiple of two channel receivers. That is, the invention may be utilized with receivers having two, four, six or any multiple of two channels. The invention may also be utilized with a single channel receiver by adding an additional channel thereto and incorporating the interference canceler of the invention.

Obviously, many modifications and variations of the invention are possible in light of the above teachings. It is therefore to be understood that within the scope of the appended claims the invention may be practiced otherwise than as has been specifically described.

What is claimed is:

1. A communications device for cancelling pulse interference received by a multi-channelled receiver comprising:

pulse normalizers individual to said receiver channels and operably coupled thereto for normalizing pulses received on said receiver channels into normalized pulses of preselected pulse time widths;

a coincidence pulse detector operably coupled to said pulse normalizers for detecting simultaneous normalized pulses, said simultaneous normalized pulses corresponding to pulses received on two or more of said receiver channels; and pulse suppressors individual to said receiver channels and operably coupled thereto and to said coincidence pulse detector for cancelling said pulses received on said two or more receiver channels when simultaneous normalized pulses are detected by said coincidence pulse detector.

2. The communications device of claim 1 in which said normalized pulses of preselected pulse time widths are of substantially equal pulse time widths.

3. The communications device of claim 2 further comprising output delay networks individual to said channels and operably coupled to said receiver channels and said pulse suppressors for delaying pulses received on said channels so that no part of said pulses received on said channels is output from said pulse suppressors when simultaneous normalized pulses are present.

4. The communications device of claim 1 in which said pulse normalizers each include a monostable multivibrator, said pulses received on said receiver channels being applied to said multivibrators with said normalized pulses of preselected pulse time widths being output from said multivibrators.

5. The communications device of claim 1 in which said coincidence pulse detector includes an AND gate operably coupled to the outputs of a pair of said pulse normalizers to receive normalized pulses from each of said pulse normalizers, said AND gate having an output corresponding to the presence or absence of simultaneous normalized pulses applied to said AND gate.

6. The communications device of claim in which said pulse suppressors each include an AND gate, each of said AND gates being operatively coupled to an individual receiver channel to receive pulses from said channel and being operatively coupled to said coincidence pulse detector to receive the output of said coincidence pulse detector, the output of said AND gate being applied to said individual receiver channels.

7. The communications device of claim 1 in which said pulses received on said channels are radio frequency pulses.

8. The communications device of claim 1 in which said pulses received on said channels are video pulses.

9. A communications system comprising:
first signal normalizing means for normalizing a received pulse signal to provide a normalized pulse of preselected pulse width;
second signal normalizing means for normalizing a received pulse signal to provide a normalized pulse of a preselected pulse width;
coincidence pulse detector means operably coupled to said first and second signal normalizing means for generating a blanking pulse of preselected pulse width upon detecting the simultaneous presence of a normalized pulse from said first and second signal normalizing means;
a first output delay and pulse generating means operably coupled to said first signal normalizing means for generating a first output pulse of preselected pulse width delayed by at most the pulse width of said normalized pulse from said first signal normalizing means, the width of said first output pulse and said normalized pulse from said first signal normalizing means being no greater than the width of said blanking pulse;
a second output delay and pulse generating means operably coupled to said second signal normalizer means for generating a second output pulse of preselected pulse width delayed by at most the pulse width of said normalized pulse from said second signal normalizing means, the width of said second output pulse and said normalized pulse from said second signal normalizing means being no greater than the width of said blanking pulse;
a first channel suppression gate operably coupled to said first output delay and pulse generating means to receive said first output pulse and operably coupled to said coincidence pulse detector means to receive said blanking pulse, so that the presence of said blanking pulse at said first channel suppression gate will suppress an output of said first output pulse from said first channel suppression gate; and
a second channel suppression gate operably coupled to said second output delay and pulse generating means to receive said second output pulse and operably coupled to said coincidence pulse detector means to receive said blanking pulse, so that the presence of said blanking pulse at said second channel suppression gate will suppress an output of said second output pulse from said second channel suppression gate.

10. The communications system of claim 9 in which said normalized pulse provided by said first signal normalizing means and said normalized pulse provided by said second signal normalizing means are of substantially equal pulse widths.

11. The communications system of claim 9 in which said first and second signal normalizing means each include a monostable multivibrator, said received pulse signals being applied to said multivibrators with said normalized pulses of preselected pulse time widths being output from said multivibrators.

12. The communications system of claim 9 in which said coincidence pulse detector means includes an AND gate, said normalized pulse provided by said first signal normalizing means being a first input into said AND gate with said normalized pulse provided by said second signal normalizing means being a second input into said AND gate, said AND gate having an output corresponding to the presence or absence of simultaneous normalized pulses applied to said AND gate.

13. The communications system of claim 12 in which said coincidence pulse detector means further includes a monostable multivibrator operably coupled to receive the output of said AND gate so that said monostable multivibrator provides said blanking pulse when simultaneous normalized pulses are applied to said AND gate.

14. The communications system of claim 9 in which said first and second output delay and pulse generating means each include a monostable multivibrator.

15. The communications system of claim 14 in which said monostable multivibrator of said first output delay and pulse generating means is operably coupled to receive said normalized pulses from said first signal normalizing means to provide said first output pulse of preselected pulse width delayed by the pulse width of said normalized pulse from said first signal normalizing means, and in which said monostable multivibrator of said second output delay and pulse generating means is operably coupled to receive said normalized pulses from said second signal normalizing means to provide said second output pulse of preselected pulse width delayed by the pulse width of said normalized pulse from said second signal normalizing means.

16. The communications system of claim 9 in which said first channel suppression gate and said second channel suppression gate each include an AND gate.

17. The communications system of claim 16 in which said AND gate of said first channel suppression gate is operably coupled to receive the output of said coincidence pulse detector means and of said first output delay and pulse generating means so that the presence of said blanking pulse at said AND gate of said first channel suppression gate will suppress the output of said first output pulse from said AND gate of said first channel suppression gate, and in which said AND gate of said second channel suppression gate is operably coupled to receive the output of said coincidence pulse detector means and of said second output delay and pulse generating means so that the presence of said blanking pulse at said AND gate of said second channel suppression gate will suppress the output of said second output pulse from said AND gate of said second channel suppression gate.

18. The communications device of claim 9 in which said pulses received on said channels are radio frequency pulses.

19. The communications device of claim 9 in which said pulses received on said channels are video pulses.

20. A method for suppressing pulse interference comprising:
   normalizing a pulse received on a first receiver channel into a first normalized pulse of preselected pulse time width;
   normalizing a pulse received on a second receiver channel into a second normalized pulse of preselected time width;
   detecting whether said first normalized pulse is simultaneously present with said second normalized pulse; and
   suppressing said pulse received on said first receiver channel and said pulse received on said second receiver channel when said first normalized pulse is detected to be simultaneously present with said second normalized pulse.

21. The method of claim 20 in which said first normalized pulse of preselected pulse time width and second normalized pulse of preselected time width are of substantially equal pulse time widths.

22. The method of claim 21 further including the step of delaying said pulse received on said first receiver channel and said pulse received on said second receiver channel by a delay substantially equal to the preselected pulse time width of one of said normalized pulses, said step of delaying occurring before said step of suppressing.

23. A method for suppressing pulse interference comprising:
   normalizing a pulse received on a first receiver channel into a first normalized pulse of preselected pulse time width;
   normalizing a pulse received on a second receiver channel into a second normalized pulse of predetermined time width;
   detecting whether said first normalized pulse is simultaneously present with said second normalized pulse;
   generating a first output pulse in response to receiving said pulse on said first receiver channel;
   generating a second output pulse in response to receiving said pulse on said second receiver channel; and
   suppressing said first and second output pulses when said first normalized pulse is simultaneously present with said second normalized pulse.

24. The method of claim 23 in which the first and second normalized pulses of preselected pulse time widths are of substantially equal pulse time widths.

25. The method of claim 24 in which the steps of generating said first output pulse and said second output pulse includes generating output pulses of preselected pulse time widths.

26. The method of claim 25 in which the first and second output pulses of preselected pulse time widths are of substantially equal pulse time widths.

27. The method of claim 26 in which the step of generating said first and second output pulses includes delaying the generating of said first and second output pulses by a delay substantially equal to the preselected pulse width of said normalized pulse.

28. The method of claim 27 in which the step of detecting includes comparing in time the presence or absence of said first normalized pulse with the presence or absence of said second normalized pulse and providing an output corresponding to the presence or absence of simultaneous first and second normalized pulses.

29. The method of claim 28 in which the step of detecting includes generating a blanking pulse when said an output corresponds to said first normalized pulse being simultaneously present with said second normalized pulse, said blanking pulse being of a pulse width that is no less than the combined width of one of said output pulses and one of said normalized pulses.

30. The method of claim 29 in which the step of suppressing includes cancelling said first and second output pulses when said blanking pulse is present.

* * * * *